United States Patent [19]

Champon et al.

[11] Patent Number: 4,554,568
[45] Date of Patent: Nov. 19, 1985

[54] TEMPERATURE-COMPENSATED ZENER DIODE

[75] Inventors: Jacques Champon, Creteil; Bruno Maurice, Eguilles; Michel Rouméguere, Gif sur Yvette, all of France

[73] Assignee: Commissariat a l'Energie Atomique, Paris, France

[21] Appl. No.: 391,919

[22] Filed: Jun. 24, 1982

[30] Foreign Application Priority Data

Jun. 30, 1981 [FR] France .................. 81 12846

[51] Int. Cl.[4] ............................................ H01L 29/90
[52] U.S. Cl. ....................................... 357/13; 357/64; 357/28; 357/76; 357/37; 357/38; 357/33
[58] Field of Search ............... 357/13, 64, 13 R, 13 Z, 357/28, 76, 37, 38, 33

[56] References Cited

U.S. PATENT DOCUMENTS

| 2,936,425 | 5/1960 | Shockley | 357/13 X |
| 3,416,046 | 12/1968 | Dickson, Jr. et al. | 357/13 X |
| 3,440,113 | 4/1969 | Wolley | 357/64 X |
| 3,723,832 | 3/1973 | Bachmeier | 357/13 |
| 3,953,254 | 4/1976 | Valdman | 357/13 X |
| 3,992,715 | 11/1976 | Delagebeaudeuf et al. | 357/33 X |
| 4,079,402 | 3/1978 | Dunkley et al. | 357/13 |
| 4,200,877 | 4/1980 | Suzuki et al. | 357/28 X |
| 4,349,394 | 9/1982 | Wei | 357/13 X |

FOREIGN PATENT DOCUMENTS 1126309 9/1968 United Kingdom ............ 357/64 X

Primary Examiner—Andrew J. James
Assistant Examiner—William A. Mintel
Attorney, Agent, or Firm—Oblon, Fisher, Spivak, McClelland & Maier

[57] ABSTRACT

An irradiation-stable, temperature-compensated Zener diode and a process for producing the Zener diode. The diode includes a first pn junction having metallic impurities diffused into the corresponding type n region, a second pn junction with a type n region differing from that of the first pn junction, the two junctions being interconnected so that the first junction is forward-biased while the second junction is reversed-biased. Two metal layers acting as electrical contacts are deposited on each p region and there are two insulating layers.

5 Claims, 3 Drawing Figures

TEMPERATURE-COMPENSATED ZENER DIODE

BACKGROUND OF THE INVENTION

The present invention relates to a temperature-compensated Zener-diode and a process for its production. The diode is to be able to operate under irradiation, such as neutron irradiation.

It is known that a diode is an electronic component constituted by a semiconductor material having an n region and a p region, the association of these two regions giving a pn junction.

The continuous line in FIG. 1 indicates the characteristic of a diode, i.e. the curve giving the electric current I as a function of the voltage V. The diode has two possible operating modes, depending on the direction of travel of the current passing through it.

Part A of the characteristic corresponds to forward biased operation, i.e. the current enters the diode by the n region.

In part A of the characteristic the voltage rises rapidly as a function of the current until it reaches a value $V_D$, above which the voltage varies little. Generally voltage $V_D$ is between 0.5 and 1 V. In part B of the characteristic the current remains substantially zero until the voltage reaches a value $V_Z$, called the avalanche or Zener voltage, above which the current rises very rapidly.

A temperature-compensated Zener diode or TCZ is a semiconductor component, whose function is to form a voltage reference, i.e. it guarantees a stable voltage no matter what the ambient conditions and in particular the temperature, supply variation, neutron irradiation, etc. Its function consists of opposing two pn junctions, one reverse-biased and the other forward-biased. This leads to a temperature-minimized voltage drift resulting from an adjustment between the positive drift or $dV_z/dT$ ratio of the reverse-biased junction or Zener junction and the negative drift or $dV_D/dT$ ratio of the forward-biased junction, the ratio depending little on the voltage $V_D$, i.e. about $-1.5/°$ C. for a voltage $V_D$ of about 0.6 to 0.7 V. Conversely to obtain a variation $dV_z/dT$ of the same order of magnitude (but positive), it is necessary to have a value of the Zener voltage $V_z$ of about 5.5 to 5.6 V, leading to a total voltage of the temperature-compensated device of about 6.1 to 6.3 V.

Thus, all the construction technology of a temerature-compensated diode must be directed at providing two pn junctions having very different operating characteristics, but whereof the temperature drifts are very close to one another in absolute values. For information the temperature drift of a reverse-biased junction for $V_Z$ equal to 5.5 V is about $2.10^{-4}/°$ C. The compensation by a forward biased junction must be able to bring this value to at the most $10^{-5}/°$ C.

Among the hitherto known temperature-compensated Zener diode production processes one of them shown in FIG. 2 consists of producing pn junctions (or Zener diodes) by epitaxy, i.e. the p regions are deposited on a type n substrate by means of an iodine-based vector gas, followed by the annealing of the junctions. This procedure has the advantage of "burying" the active part of the pn junction a long way from surface interference leading to good reliability and reproducibility, so that high quality diodes are obtained. The main production parameters are then the resistivity of the initial substrate which is linked with the concentration of the doping particles for the N region and the annealing times and temperatures for the various operations.

The complete assembly of the TCZ diode is based on the aforementioned process and is of a monolithic nature, the two pn junctions are produced on the same type n substrate leading to an ideal thermal coupling when they are joined. For more details on the production of such a diode reference should be made to French Pat. No. 1,522,532 filed on Mar. 17, 1967 by Sescosem and entitled "Improvements to Zener diodes".

FIG. 2 shows such a TCZ diode, part 2 corresponding approximately to the forward-biased pn junction formed by P region 6 and N region 14 arrow I giving the direction of the current flowing through the diode and part 4 corresponding to the reverse-biased or Zener pn junction formed by N region 14 and P region 16. Region 6 is the buried or embedded active region of the pn junction. The diode is also provided with two conductive layers 8 placed on the two p regions from which lead connections 10 enabling the diode to be connected to different electrical circuits, and two insulating layers 12 deposited on part of the two n regions.

However, such a TCZ diode undergoes serious damage when exposed to neutron irradiation and in particular its characteristic curve is modified. These modifications are represented by dotted lines in FIG. 1.

It can be seen that the voltage $V_D$ decreases greatly, whilst the temperature coefficient $dV_D/dT$ increases in absolute values. Moreover the Zener voltage $V_Z$ increases, whereas the temperature coefficient $dV_Z/dT$ decreases. Thus, there are significant variations to the total reference voltage and to the temperature coefficient.

In simplified terms, the deterioration of the electrical characteristics of the diode results from the creation of defects or voids in the semiconductor material resulting from neutron bombardments and corresponding to a displacement of the atoms constituting the material. These defects tend to move and regroup with other impurities forming what are called complex defects and they modify the electrical charaacteristics of the diodes.

BRIEF SUMMARY OF THE INVENTION

The object of the invention is a temperature-compensated Zener diode and a process for producing such a diode obviating the above disadvantages and able to operate under neutron irradiation.

More specifically the present invention relates to a temperature-compensated Zener diode, wherein a first pn junction is produced by depositing by epitaxy a first p type silicon layer on a first type n silicon substrate and then subjecting it to a diffusion of metallic impurities, the diffusion being performed in the n region of the junction, and a second pn junction is separately produced by depositing by epitaxy a second type p silicon layer on a second type n silicon substrate different from the first type n silicon substrate, and wherein the two pn junctions are joined in such a way that the first pn junction can be forward-biased and the second pn junction can be reverse-biased.

The diffusion of metallic impurities makes it possible to retain, following neutron irradiation of the Zener diode obtained according to the invention, a precision on the temperature drift at the most equal to $10^{-5}/°$ C.

According to a preferred embodiment of the inventive process, the metallic impurities are gold atoms. According to another preferred embodiment of the inventive process, diffusion of the metallic impurities takes place at a temperature between 1000° and 1200° C. and preferably at 1100° C. for about 1 hour.

The concentration of the number of diffused metallic impurities defines the effectiveness of the temperature compensation, the latter being defined by the diffusion temperature and time.

According to another preferred embodiment of the invention, the first type n silicon substrate contains $2.4 \times 10^{18}$ phosphorus atoms/cm$^3$ and the second type n silicon substrate contains $2.8 \times 10^{18}$ phosphorus atom/cm$^3$.

The invention also relates to a temperature-compensated Zener diode, including a first pn junction having a first type p silicon region and a first type n silicon region incorporating metallic impurities introduced into the type n region by diffusion; and a second pn junction having a second type p silicon region and a second type n silicon region, wherein the second type n silicon region is obtained by doping differing from that carried out for the first type n region, the junctions being interconnected in such a way that the first pn junction can be forward-biased while the second junction is reverse-biased.

BRIEF DESCRIPTION OF THE DRAWINGS

The invention is described in greater detail hereinafter relative to non-limitative embodiments and attached drawings, wherein like reference numerals designate identical or corresponding parts, and wherein.

DETAILED DESCRIPTION OF THE PREFERRED EMBODIMENTS

According to the invention the production of a TCZ diode comprise separately producing two pn junctions and then joining them, so that one can be forward-biased while the other is reverse-biased. The two pn junctions are produced very differently.

With regards to the forward-biased pn junction, it is produced by depositing by epitaxy a type p-silicon substrate on a type n silicon substrate and then diffusing at high temperature metallic impurities such as impurities of platinum, iron, gold, etc. As the technology of diffusing gold is the easiest to control, preference will be given to this impurity. This diffusion can take place by e.g. starting with a gold-silicon ectectic realized on the n region of the junction and then performing a high temperature annealing stage.

It should be noted that the effectiveness of the temperature compensation under neutron irradiation of a TCZ diode is dependent on the concentration of the diffused metallic impurities. The concentration depends on the duration and temperature of the annealing process. For example annealing is performed for about one hour at between 1000° and 1200° C. Research has shown that the best diffusion temperature is about 1100° C., which makes it possible to obtain a gold concentration of of approximately $2 \times 10^{16}$ atoms/cm$^3$.

The diffused metallic impurities are substituted for the silicon atoms constituting the substrate. These negatively charged metallic impurities play the same part as the complex defects produced during the neutron bombardment of a prior art TCZ diode, but the defects corresponding to the metallic impurities are much more stable.

With regards to the pn or Zener juntion 4 to be reverse, it can be produced by depositing by epitaxy a type p silicon region 16 on a type n silicon substrate 14. The production of a Zener junction 4 by epitaxy has already been described in detail in French Pat. No. 1,522,532.

To obtain an efficient temperature compensation, the production of the Zener junction 4 can be completed by subjecting it to a slight heat treatment. The latter makes it possible to adjust the diffusion of the type p impurities into the type n substrate 14 of the Zener junction 4, thereby bringing about an optimum adaptation of the temperature coefficient of this junction to that of the junction to be forward-biased.

Figure 1:
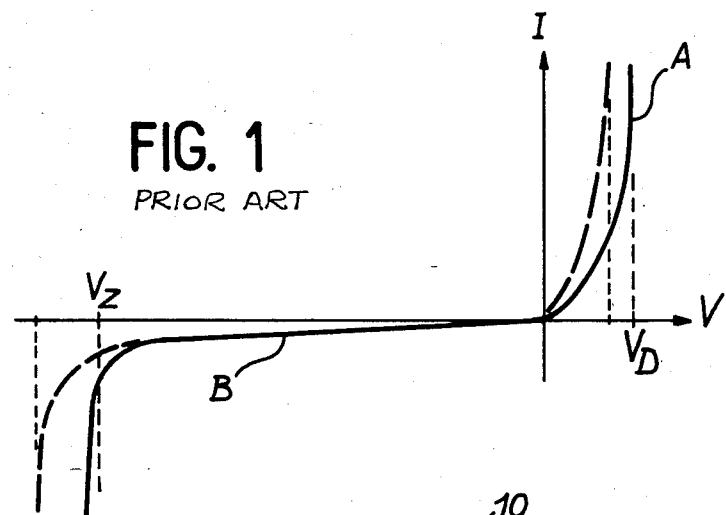
FIG. 1, already described, is a graph showing the characteristic of a Zener diode, i.e. the curve giving the current I as a function of the voltage V.
Figure 2:
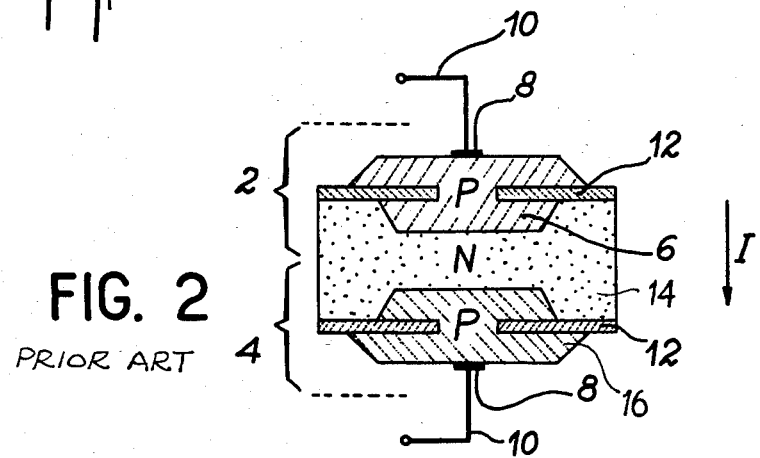
FIG. 2, already described, is a cross-sectional view of a prior art temperature-compensated Zener diode.
Figure 3:
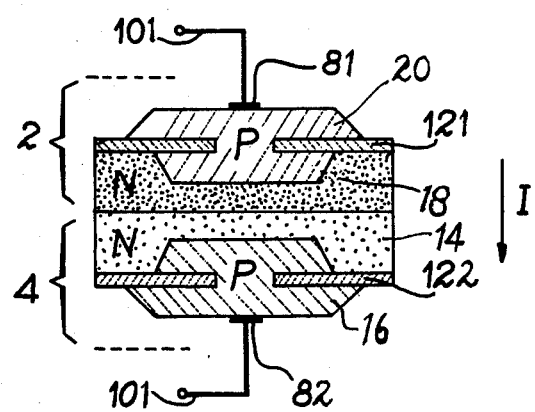
FIG. 3 is a cross-sectonal view of a temperature-compensated Zener diode obtained by the process of the invention.

FIG. 3 shows a TCZ diode produced by the process according to the invention.

Unlike in the case of the prior art TCZ diodes the two pn junctions 2, are separate, hence the presence of the two separate n regions 18, 14. As previously reference number z designates the forward-biased pn junction, the direction of the current flowing through the diode being given by arrow I, whilst reference number 4 designates the reverse-biased or Zener pn junction 4. In the same way reference numeral 81, 82 correspond to two conductive regions respectively deposited over the two p regions 20, 16 from which extend respective connections 101, 102 and reference numerals $12_1$, $12_2$ correspond to two insulating layers respectively deposited on part of the two n regions 18, 14.

Research has shown that the nature of the initial type n silicon substrate for the two pn junctions, like the high temperature diffusion of metallic impurities, plays an important part in connection with the voltage stability and the temperature coefficient, particularly under neutron irradiation.

To obtain a good temperature compensation according to the invention, the type n substrate 18 of the forward-biased pn junction 2 is obtained by the e.g. homogeneous doping of a silicon substrate by means of phosphorus atoms, so that the type n substrate 18 contains 2 to $3 \times 10^{18}$ atoms/cm$^3$ and preferably $2.4 \times 10^{18}$ atoms/cm$^3$. In the same way the type n substrate 14 of the Zener junction 14 is obtained by doping a silicon substrate by means of phosphorus atoms, so that it contains 2 to $3 \times 10^{18}$ atoms/cm$^3$ and preferably $2.8 \times 10^{18}$ atoms/cm$^3$.

The type p region 16 can be obtained by doping a silicon substrate 14 with boron having a concentration of about $10^{20}$ atoms/cm$^3$ and the epitaxy of the p region 16 on the n substrate can last about 20 minutes.

For the TCZ diodes obtained according to the invention, the voltage drift is approximately 2 millivolts after subjecting the diodes to a neutron flux of $10^{14}$ neutrons/cm$^2$ (equivalent to 1 MeV) and the precision on the temperature drift of these diodes is maintained. Generally the precision is below $10^{-5}/°$ C.

What is claimed is:

1. A temperature compensated Zener diode comprising:
   a first pn junction;
   a second pn junction distinct from said first junction wherein said first junction is joined to said second junction in such a way that said first pn junction can be forward-biased while said second pn junction is reverse-biased, and wherein said first junction has a first p-type silicon layer containing no diffused metal impurities and wherein said first p-type silicon layer is deposed on a first n silicon substrate wherein said first n silicon substrate has a first doping and wherein said first silicon substrate contains diffused metallic impurities, and wherein said second junction has a second p-type silicon layer deposed on a second n silicon substrate with said second n silicon substrate having a second doping distinct from said first doping and said second n silicon substrate contains no metallic impurities, and wherein said first and second substrates are in contact with each other and wherein a precise discontinuity in the structure of the Zener diode is formed by said contact between said first and second substrates.

2. A Zener diode according to claim 1, wherein the first type n silicon region contains $2.4 \times 10^{18}$ phosphorus atoms/cm$^3$.

3. A Zener diode according to claim 2, wherein the second type n silicon region contains $2.8 \times 10^{18}$ phosphorus atoms/cm$^3$.

4. A Zener diode according to claim 1, wherein the diffused metallic impurities are gold atoms.

5. A Zener diode according to claim 4, wherein the concentration of the gold atoms is $2 \times 10^6$ atoms/cm$^3$.

* * * * *